(12) United States Patent
Betz et al.

(10) Patent No.: US 7,051,313 B1
(45) Date of Patent: May 23, 2006

(54) AUTOMATIC GENERATION OF PROGRAMMABLE LOGIC DEVICE ARCHITECTURES

(75) Inventors: Vaughn Betz, Toronto (CA); Jonathan Rose, Toronto (CA)

(73) Assignee: Altera Toronto Co., Halifax (CA)

( * ) Notice: Subject to any disclaimer, the term of this patent is extended or adjusted under 35 U.S.C. 154(b) by 447 days.

(21) Appl. No.: 10/641,193

(22) Filed: Aug. 13, 2003

Related U.S. Application Data

(63) Continuation of application No. 09/429,013, filed on Oct. 29, 1999, now Pat. No. 6,631,510.

(51) Int. Cl.
G06F 17/50 (2006.01)

(52) U.S. Cl. .................. 716/17; 716/1; 716/2; 716/12; 716/16; 716/18

(58) Field of Classification Search ............... 716/1, 716/2, 12, 16, 17, 18
See application file for complete search history.

(56) References Cited

U.S. PATENT DOCUMENTS

| | | | |
|---|---|---|---|
| 5,197,016 A | 3/1993 | Sugimoto et al. | |
| 5,550,839 A | 8/1996 | Buch et al. | |
| 5,553,002 A | 9/1996 | Dangelo et al. | |
| 5,594,657 A | 1/1997 | Cantone et al. | |
| 5,687,325 A | 11/1997 | Chang | |
| 5,801,546 A | 9/1998 | Pierce et al. | |
| 5,825,202 A | 10/1998 | Tavana et al. | |
| 5,907,248 A | 5/1999 | Bauer et al. | |
| 5,942,913 A | 8/1999 | Young et al. | |
| 6,311,316 B1 * | 10/2001 | Huggins et al. | ............... 716/12 |
| 6,519,571 B1 | 2/2003 | Guheen et al. | |

OTHER PUBLICATIONS

H. Hseih, et al, "Third-Generation Architecture Boosts Speed and Density of Field-Programmable Gate Arrays," CICC, 1990, pp. 31.2.1-31.27.

S. Brown, J. Rose, and Z. Vranesic, "A Detailed Router for Field-Programmable Gate Arrays," IEEE Trans. on CAD, May 1992, pp. 620-628.

G. Lemieux, and S. Brown, "A Detailed Router for Allocating Wire Segments in FPGAs," ACM/SIGDA Physical Design Workshop, 1993, pp. 215-226.

M. Khellah, S. Brown and Z. Vranesic, "Minimizing Interconnection Delays in Array-Based FPGAs," CICC, 1994, pp. 181-184.

(Continued)

*Primary Examiner*—Thuan Do
(74) *Attorney, Agent, or Firm*—Fish & Neave IP Group Ropes & Gray LLP

(57) ABSTRACT

An "architecture generation engine" is operative with a CAD system to implement circuits into PLD (programmable logic device) architectures and to evaluate performances of different architectures. The architecture generation engine converts a high level, easily specified description of a PLD architecture into a highly detailed, complete PLD architecture database that can be used by a CAD toolset to map a circuit netlist into a PLD. The architecture generation engine also enables performance evaluation of a wide variety of PLD architectures for given benchmark circuits.

34 Claims, 12 Drawing Sheets

TYPICAL FLOW DIAGRAM FOR THE ARCHITECTURE GENERATION ENGINE

OTHER PUBLICATIONS

C. Ebeling, L. McMurchie, S. A. Hauck and S. Burns, "Placement and Routing Tools for the Triptych FPGA," IEEE Trans. on VLSI, Dec. 1995, pp. 473-482.

D. Cronquist and L. McMurchie, "Emerald—An Architecture-Driven Tool Compiler for FPGAs," ACM Symp. on FPGAs, 1996, pp. 144-150.

G. Lemieux, S. Brown, D. Vranesic, "On Two-Step Routing for FPGAs," ACM Symp. on Physical Design, 1997, pp. 60-66.

P. Chow, S. Seo, J. Rose, K. Chung, G. Paez and I. Rahardja, "The Design of an SRAM-Based Field-Programmable Gate Array, Part I: Architecture," Jun. 1999, pp. 191-197.

* cited by examiner

BLOCK DIAGRAM OF A TYPICAL PLD ARCHITECTURE

TYPICAL PLD ARCHITECTURE EVALUATION FLOW DIAGRAM

CAD FLOW DIAGRAM PROPOSED BY THIS INVENTION FOR
PLD ARCHITECTURE GENERATION AND EVALUATION

POSSIBLE CONNECTION-BLOCK POPULATION VALUES FOR LENGTH 5 WIRE SEGMENTS.

```
io_rat 2                              # 2 IO pads per row or column
chan_width_io 1                       # All channels the same width.
chan_width_x uniform 1
chan_width_y uniform 1

# 4-input LUT.  LUT inputs first, then output, then clock.
inpin class: 0 bottom                 # Equivalence class 0 is LUT inputs
inpin class: 0 left
inpin class: 0 top
inpin class: 0 right
outpin class: 1 bottom                # Output.  Not equivalent to anything.
inpin class: 2 global top             # Clock.

switch_block_type subset              # Called disjoint switch block by some.
Fc_type fractional                    # Fc values are relative to W
Fc_output 1
Fc_input 1
Fc_pad 1

# Definitions of different types of routing wires.
segment frequency: 0.2 length: 1 wire_switch: 0 opin_switch: 1 Frac_cb: 1. \
        Frac_sb: 1. Rmetal: 4.16 Cmetal: 81e-15
segment frequency: 0.4 length: 2 wire_switch: 2 opin_switch: 2 \
        Frac_cb: 1. Frac_ab: 1 Rmetal: 4.16 Cmetal: 8le-15
segment frequency: 0.4 length: 4 wire_switch: 2 opin_switch: 2 \
        Frac_cb: 1. Frac_sb: 1 Rmetal: 4.16 Cmetal: 81e-15

# Definitions of different types of routing switches.
# Pass transistor switch.
switch 0 buffered: no R: 196.728 Cin: 20.574e-15 Cout: 20.574e-15 Tdel: 0
# Logic block output buffer used to drive pass transistor switched wires.
switch 1 buffered: yes R: 393.47 Cin: 7.512e-15 Cout: 20.574e-15 Tdel: 524e-12
# Switch used as a tri-state buffer within the routing, and also as the
# output buffer used to drive tri-state buffer switched wires.
switch 2 buffered: yes R: 786.9 Cin: 7.512e-15 Cout: 10.762e-15 Tdel: 456e-12

# Used only by the area model.
R_minW_nmos 1967
R_minW_pmos 3738

# Timing info below.  See manual for details.
C_ipin_cblock 7.512e-15
T_ipin_cblock 1.5e-9
T_ipad 478e-12                        # clk_to_Q + 2:1 mux
T_opad 295e-12                        # Tsetup
T_sblk_opin_to_sblk_ipin 0.
T_clb_ipin_to_sblk_ipin 0.
T_sblk_opin_to_clb_opin 0.

subblocks_per_clb 1
subblock_lut_size 4
T_subblock T_comb: 546e-12 T_seq_in: 845e-12 T_seq_out: 478e-12
```

FIG. 5
Example architecture description file

MODELLING FPGA ROUTING ARCHITECTURE AS A DIRECTED GRAPH

TYPICAL FLOW DIAGRAM FOR THE ARCHITECTURE
GENERATION ENGINE

EXAMPLE CONNECTION BLOCK PATTERN: PATHOLOGICALLY BAD

NETS STARTING AT OUT2 CAN ONLY REACH IN2,
NETS STARTING AT OUT1 CAN ONLY REACH IN1.

EXAMPLE CONNECTION BLOCK PATTERN: GOOD.

NETS STARTING AT EITHER OUTPUT CAN REACH
EITHER INPUT; VASTLY IMPROVED ROUTABILITY

ARCHITECTURE SPECIFICATION: DISJOINT SWITCH BLOCK

ARCHITECTURE SPECIFICATION: SEGMENTATION DISTRIBUTION.

EACH CHANNEL CONTAINS 3 WIRES OF LENGTH THREE.

ADJUSTING THE SEGMENT START POINTS ALLOWS BOTH THE HORIZONTAL AND VERTICAL CONSTRAINTS TO BE SATISFIED. THE FPGA COORDINATE SYSTEM IS ALSO SHOWN.

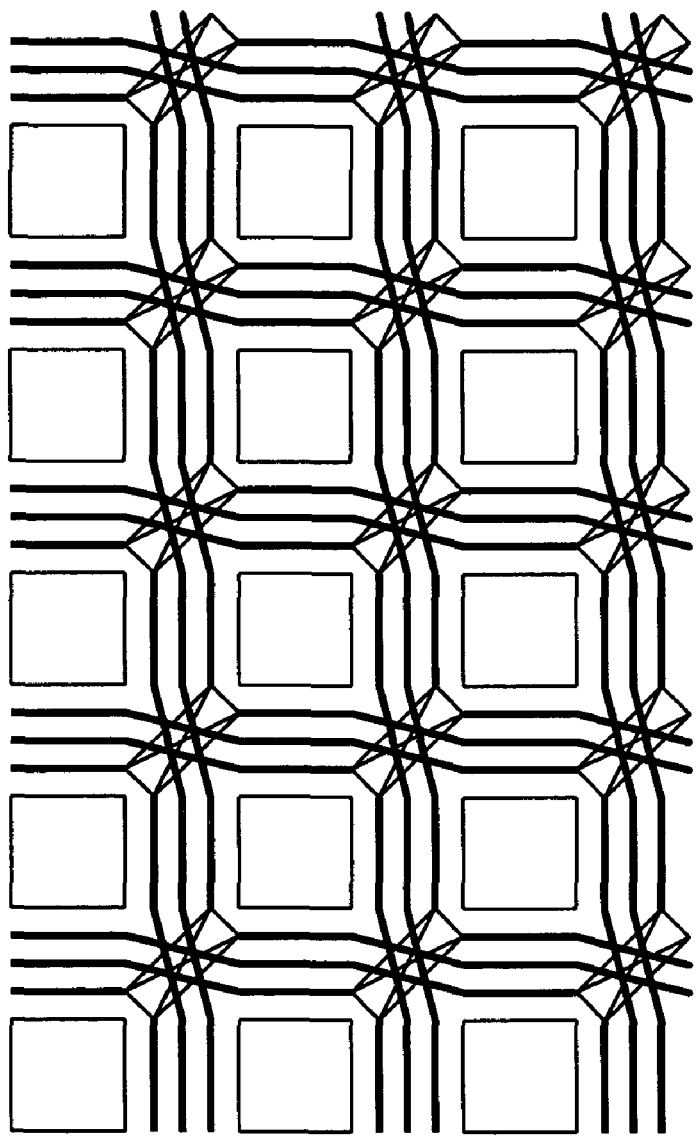
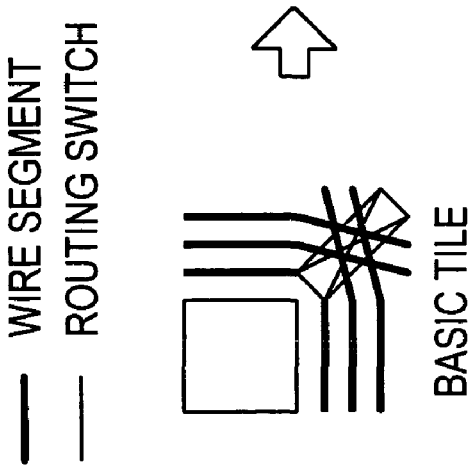
FPGA COMPOSED BY ARRAYING TILES
TILED LAYOUT TO IMPLEMENT FPGA OF FIGURE 11
FIG. 12
— WIRE SEGMENT
— ROUTING SWITCH
BASIC TILE

AUTOMATIC GENERATION OF PROGRAMMABLE LOGIC DEVICE ARCHITECTURES

CROSS REFERENCE TO RELATED APPLICATION

This is a continuation of U.S. patent application Ser. No. 09/429,013, filed Oct. 29, 1999, now U.S. Pat. No. 6,631,510, which is incorporated by reference herein in its entirety.

BACKGROUND OF THE INVENTION

This invention relates generally to programmable logic devices (PLDs), and more particularly to a method and system for generation and evaluation of architectures for such devices.

PLDs are a widely used form of integrated circuit because of the flexibility provided by their customizable nature. In general, PLDs include field programmable gate arrays (FPGAs), complex programmable logic devices (CPLDs), simple programmable logic devices, and laser programmable devices. Architecturally, a PLD includes logic blocks and input/output (I/O) blocks which are connectable through a programmable interconnect structure.

A typical PLD is an integrated circuit chip that, wholly or in part, includes an array of one or more logic blocks, I/O blocks, and a programmable routing or interconnect network. The interconnect network can be programmed by a user to provide a connection between the logic and I/O blocks to achieve a desired logic function. A PLD can be a standalone device or embedded in a larger integrated circuit such as an ASIC or the like. Exemplary forms of such embedded PLDs are disclosed in U.S. Pat. Nos. 5,687,325 and 5,825,202.

Logic blocks may have a fixed logic function or may also have programmable functionality and programmable interconnect networks. Logic blocks may be further broken down into sub-blocks or grouped together as a cluster of logic blocks. These blocks may also include I/O circuits that can be connected to external circuits or to other parts of the chip as in the case of an embedded PLD. The I/O blocks are typically arranged at the periphery of a chip.

A PLD is typically arranged as a regular array of logic blocks, each of which may be identical or may be one of several different types (such as memory blocks, look-up table based blocks, p-term based blocks, etc.). The conductors of the programmable interconnect network are typically arranged along rows and columns defined by the array of logic blocks, as shown in FIG. 1.

The architecture of a PLD specifies the structure of its logic blocks, I/O blocks, and programmable interconnect network. In order to develop a high-quality PLD architecture, the PLD designer should evaluate the impact and utility of a wide range of architectural decisions and trade-offs. The performance of a PLD is typically judged on the basis of operational parameters of circuits implemented in the PLD. These operational parameters include
(1) speed of circuits implemented in the PLD,
(2) semiconductor or silicon area required to implement a given circuit in the PLD, (3) power dissipation of the PLD after it has been programmed, (4) reliability, and (5) routing flexibility.

The typical procedure for evaluating different architectures is shown in FIG. 2. A set of benchmark circuits is implemented in each PLD architecture (or architecture variant) of interest, and the operational parameters of the circuits are analyzed. Generally, PLD designers prefer to experiment with as wide a variety of PLD architectures as possible in order to determine the architecture or class of architectures that best meets the operational parameters of interest.

However, in order to implement circuits in a PLD architecture of interest, the PLD designer requires a method of describing the PLD architecture to a CAD toolset. There are two basic components of a PLD architecture: the routing architecture which describes the routing resources or programmable interconnect network, and the logic (or function) block architecture. Consider first the problem of describing the PLD routing architecture.

To specify a PLD architecture in its entirety, the location of every switch, routing wire, and logic and I/O block pin should be specified. The routing wires and logic and I/O blocks that can be interconnected by programmable switches should also be specified, as well as the delay of every programmable switch, routing wire, and circuit path through a logic block. This is an enormous amount of data—typically tens to hundreds of megabytes (MB) in size. Accordingly, it is not practical for a PLD architect to specify this data directly for every PLD architecture in which he or she is interested.

The most straightforward way of describing a PLD routing architecture is to create a directed graph (also called a routing-resource graph) that fully specifies all the connections that may be made in the routing of a circuit in the PLD. In essence, this requires the PLD designer to describe where every switch, interconnect wire, and logic and I/O block connection pin is located. This description should specify which routing wires, logic blocks, and I/O blocks can be interconnected by programmable switches. The description should also specify the delay of every programmable switch, interconnect wire, and circuit path through a logic block in the entire PLD. This is a very general representation of a PLD and is typically the data structure used internally by the routing tool. However, it is not very practical to specify this routing-resource graph manually because the routing-resource graph for a typical PLD requires an enormous amount of data—typically in the tens to hundreds of MBs of memory in size. Essentially, this is too low-level a description for a PLD architect to use conveniently.

A more practical approach is to design manually a basic tile (which has a single logic block and its associated routing), and create a program to automatically replicate and stitch together this tile into a routing-resource graph describing the entire PLD routing architecture. However, even the manual creation of a basic tile can be too time-consuming for most PLD architectures. A typical tile contains several hundred programmable switches and wires, so it can take hours or days to describe a single tile. Furthermore, the hand-crafted tile is severely limited in the PLD interconnect or logic block resources that may be varied—for example, a hand-crafted tile is generally designed for one value of the routing channel width, W (the number of routing tracks in a channel). In many architecture experiments, W is varied in order to see how routable a given PLD architecture is, or to determine the minimum value of W that allows some desired fraction of application circuits (say 95%) to route successfully. With a tile based approach, the PLD designer should hand-craft different tiles for each different value of W to be tested. A PLD designer will often wish to investigate hundreds of different PLD architectures and tens of W values for each of these architectures. The net result is that the PLD designer is required to create thousands or tens of thousands of different basic tiles.

There has been some prior work in describing PLD routing at a higher level of abstraction. One known FPGA router is for use with island-style FPGAs. In order to quickly investigate FPGAs with different numbers of routing switches, all the code that interacted with switch patterns is localized to two routines, $F_c()$ and $F_s()$. By rewriting these two routines, the FPGA designer can target the router to an FPGA with different switch patterns. A later router used the same method to allow re-targeting to different FPGAs.

In a known CAD system, an FPGA's routing is described by means of WireC schematics—essentially schematics annotated with C-language-like code that describes switch patterns. This CAD system can convert the WireC schematics into routing-resource graphs for use by its FPGA router.

While these known routers and CAD system all reduce the labor required to specify a PLD architecture, they still require considerable hand-crafting effort. Instead of specifying every switch in a basic tile of an FPGA, these systems allow PLD designers to write software code (in either C or WireC) to generate all the switches in a basic tile. If the PLD designer writes sufficiently general code, it may be possible to change some interconnect and logic resources, such as the channel width W, and have the basic tile adapt properly. However, it is the user's task to specify this in often non-obvious code.

The second portion of a PLD architecture description details each type of function block (logic or I/O block) contained in the PLD. Both the interface to the PLD routing of each function block (i.e., a list of the inputs and outputs of the block) and a description of the logic functions that can be implemented by the function block should be provided. A concise method for providing this information is crucial to allow easy experimentation.

Also, timing and area model information for both the routing and function blocks may be included in the PLD architecture description to allow the CAD tools to estimate the speed achieved by the circuits in this architecture and the layout area consumed by the architecture.

Accordingly, there is a need for a method and system that reduces the labor involved in describing a complete PLD architecture and that allows the easy variation of many interconnect and logic resource parameters of the architecture.

SUMMARY OF THE INVENTION

In accordance with this invention, a system is provided for generating a PLD architecture. The system includes an "architecture generation engine" that converts a high-level, easily specified description of a PLD architecture into a highly detailed, complete PLD architecture database. The detailed PLD architecture can be used by a CAD toolset to map a circuit netlist into the PLD.

In another embodiment of the invention, the architecture generation engine enables performance evaluation of a wide variety of PLD architectures for given benchmark circuits.

In a further embodiment of the invention, a CAD system is provided for implementing circuits into PLD architectures and for evaluating performances of different architectures.

In accordance with a still further embodiment of the invention, a method is provided for generating an architecture for a PLD. The method includes creating a data file defining a high-level architecture description of the programmable logic device, generating unique basic elements in accordance with the description in the data file, replicating and stitching together the basic elements to create a complete PLD architecture, and generating a detailed description from the complete PLD architecture, which can be used by a CAD toolset

BRIEF DESCRIPTION OF THE DRAWINGS

The above and other advantages of the invention will be apparent upon consideration of the following detailed description, taken in conjunction with the accompanying drawings in which:

FIG. 5 is an example architecture description file;

FIG. 12 is a simplified block diagram of a tiled layout used to implement the PLD architecture of FIG. 11.

DETAILED DESCRIPTION OF THE INVENTION

Figure 1:
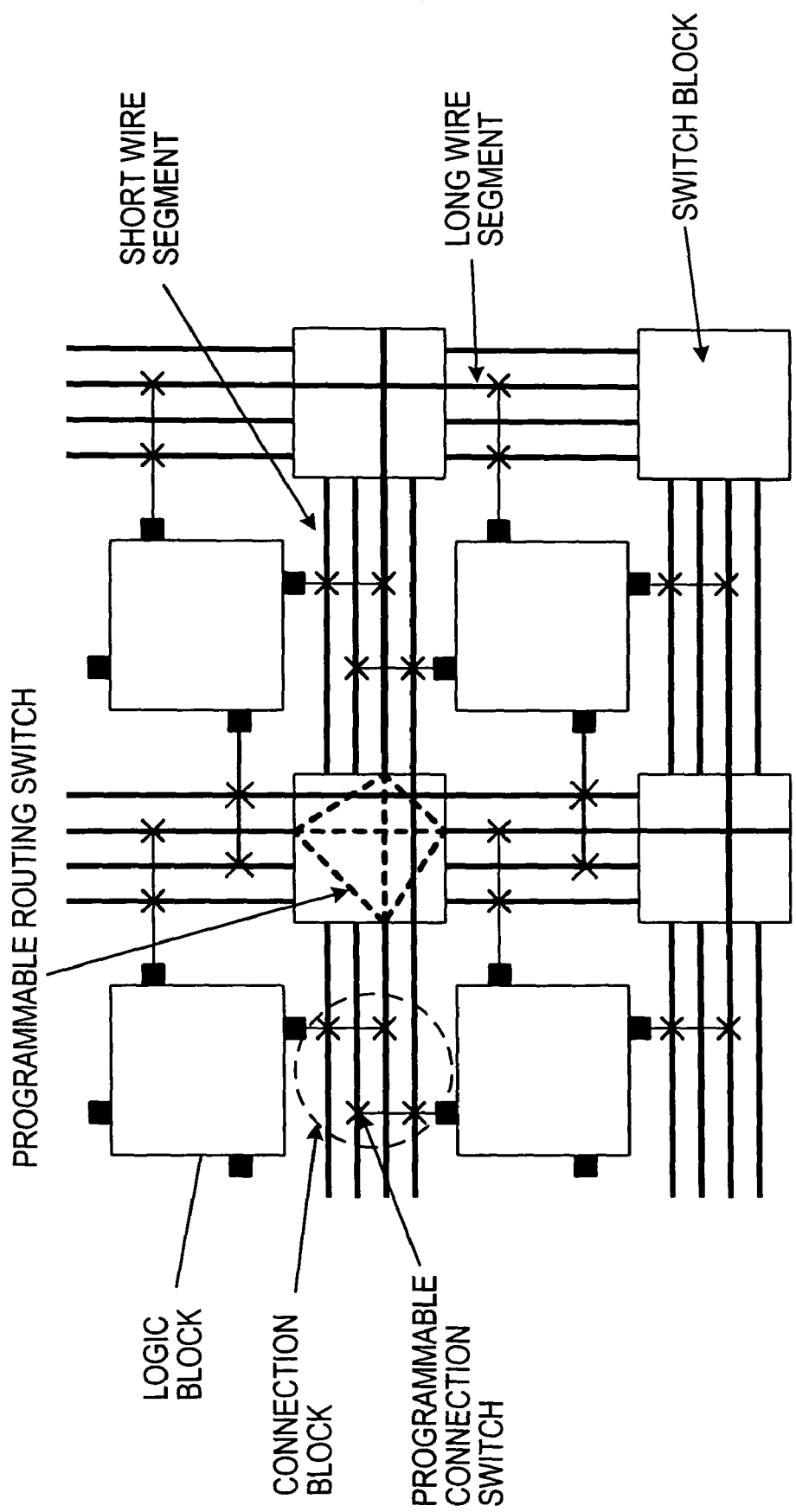
FIG. 1 is a block diagram of a typical PLD architecture.
Figure 2:
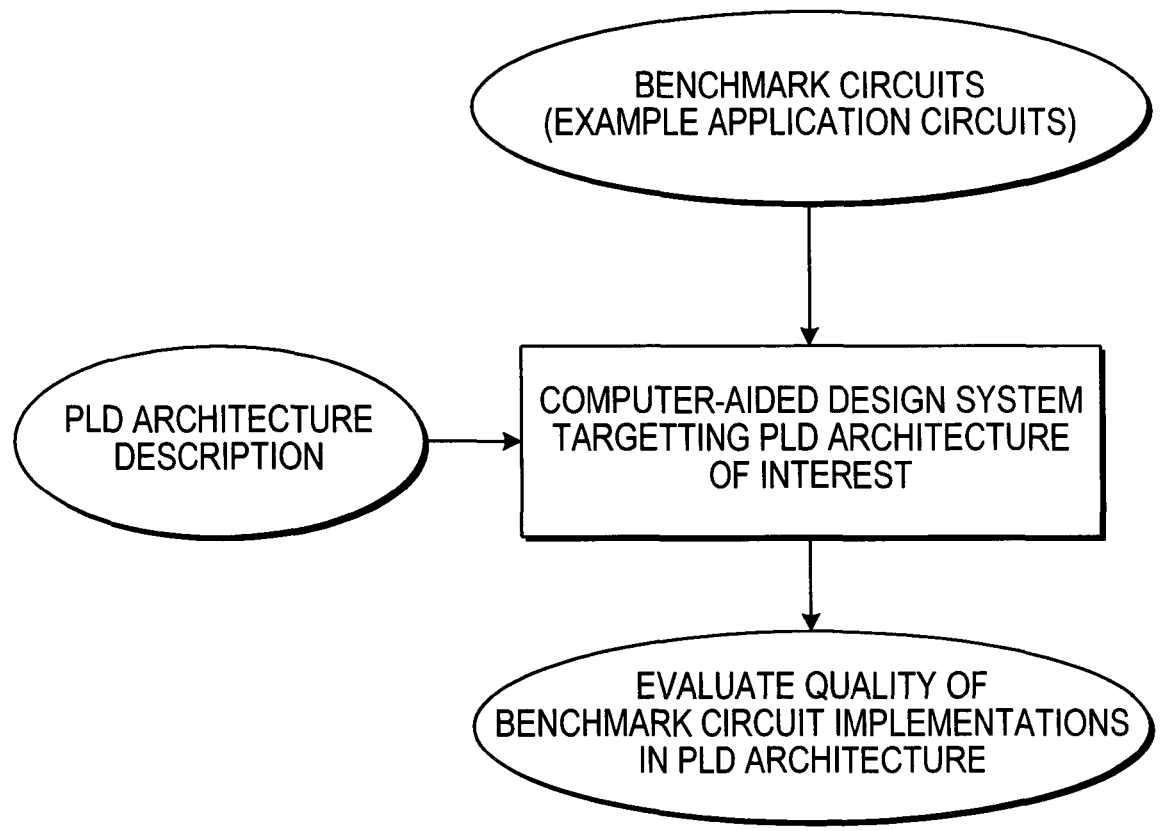
FIG. 2 is a typical PLD architecture evaluation flow diagram.

The architecture generation engine of the invention converts a preferably concise high-level description of a PLD architecture into a fully detailed is description required by CAD tools to implement circuits in a PLD and to estimate the performance of the architecture. A preferred implementation of how to represent a PLD architecture concisely, and to automatically generate the fully detailed representation of the architecture is described below. Many variations of this preferred implementation are possible, however, including using only a subset of the parameters listed below to describe a PLD or using a different set of parameters.

With a high-level PLD architecture description language, the PLD designer describes the architecture using:

The various "types" of wire used in the PLD, including the wire length (number of logic blocks spanned), and the wire resistance and capacitance, or other delay metric;

The various "types" of programmable routing switch used in the PLD, including whether each switch is a pass transistor, tri-state buffer, multiplexer, antifuse, etc.; the delay of the switch, (which may be a full delay model, such as the Elmore delay or a SPICE delay model, rather than a simple delay number); and the area of the switch, or some parameter such as equivalent resistance which allows an area model to estimate the area of the switch;

Each type of logic block and I/O block in the PLD, including a list of the input and output pins of each block, any logical equivalences between these pins, and the physical side(s) from which each pin is accessible;

The number of blocks of each type which can be placed at each physical (i,j) location within the PLD;

The relative widths of the various channels within the PLD;

Either the fraction or the absolute number of routing tracks in each type of channel that have wires of a given type;

The number and type of switches allowing each logic block pin to connect to each channel near it, or optionally a more detailed description of the pattern of switches between each logic block pin and the wires in the channels near it;

The number and type of switches used to connect routing wires of each type to each other, optionally, the set of switch patterns used to connect wires in the routing channels; and The delay through each of the combinational and sequential paths through each type of logic and I/O block. Optionally this delay may be a delay model rather than a constant delay number for each path.

Other parameters which may be either specified by the PLD architect, or which the CAD toolset can determine automatically such that a given application circuit will fit into the generated PLD architecture are:

The absolute width (in routing tracks) of some or all of the routing channels; and The number of logic blocks in the PLD (i.e., the size of the array of logic blocks).

The architecture generation engine takes this list of parameters or constraints and generates the highly detailed description of the architecture required by the CAD optimization tools to map circuits into the architecture. For example, this detailed architecture description may include:

A directed graph (the routing resource graph) that describes every element of a PLD's programmable interconnect. Each node in this graph corresponds to a "routing resource", e.g., a logic block or I/O block pin, a routing wire, a routing multiplexer or other routing element. Each edge in this graph corresponds to a possible connection (made via a programmable switch) between routing resources. Some edges may be inserted to model non-programmable switches or to assist delay modeling. Every edge and every node is annotated with information concerning its physical implementation (e.g., whether it is a wire or a pin, the length of the wire, etc.) and its delay parameters.

A directed graph (the timing graph) that explicitly represents the circuit timing when implemented in this architecture. Every edge in this graph represents a timing dependency, and every node represents a circuit pin or function.

A legal slot list that describes which type(s) of logic or I/O block can be assigned to each (i,j) location within the PLD.

There are numerous difficulties associated with the automatic generation of this fully detailed representation of the PLD from the concise, architecture description language version.

One difficulty is that the specified parameters often do not completely specify the entire PLD architecture. Intelligent choices should be made for the unspecified interactions between parameters and unspecified portions of the architecture in order to create a PLD architecture that matches the specified parameters and has good area and speed.

Another difficulty is that the specified parameters may conflict and overspecify the PLD. In this case the architecture generator must relax the specification (in as small an amount as possible) to create a PLD that still matches most of the specified parameters.

In addition to creating the fully specified detailed PLD architecture database required by the PLD CAD tools, the architecture generation engine can also automatically compute important metrics of the PLD architecture quality. The metrics it computes include:

The estimated area required to build this PLD. The architecture generation engine can compute this by traversing the detailed PLD description (the routing resource graph and the legal slot list) and by using built-in area models to estimate the area required by each wire and switch in the programmable routing and by each logic or I/O block. This area estimate can be based on metal area, active area, or both.

The estimated delay of a circuit implemented in this PLD.

The estimated power consumption of a circuit implemented in this PLD.

The estimated PLD area required by the circuit implemented in the PLD.

Figure 3:
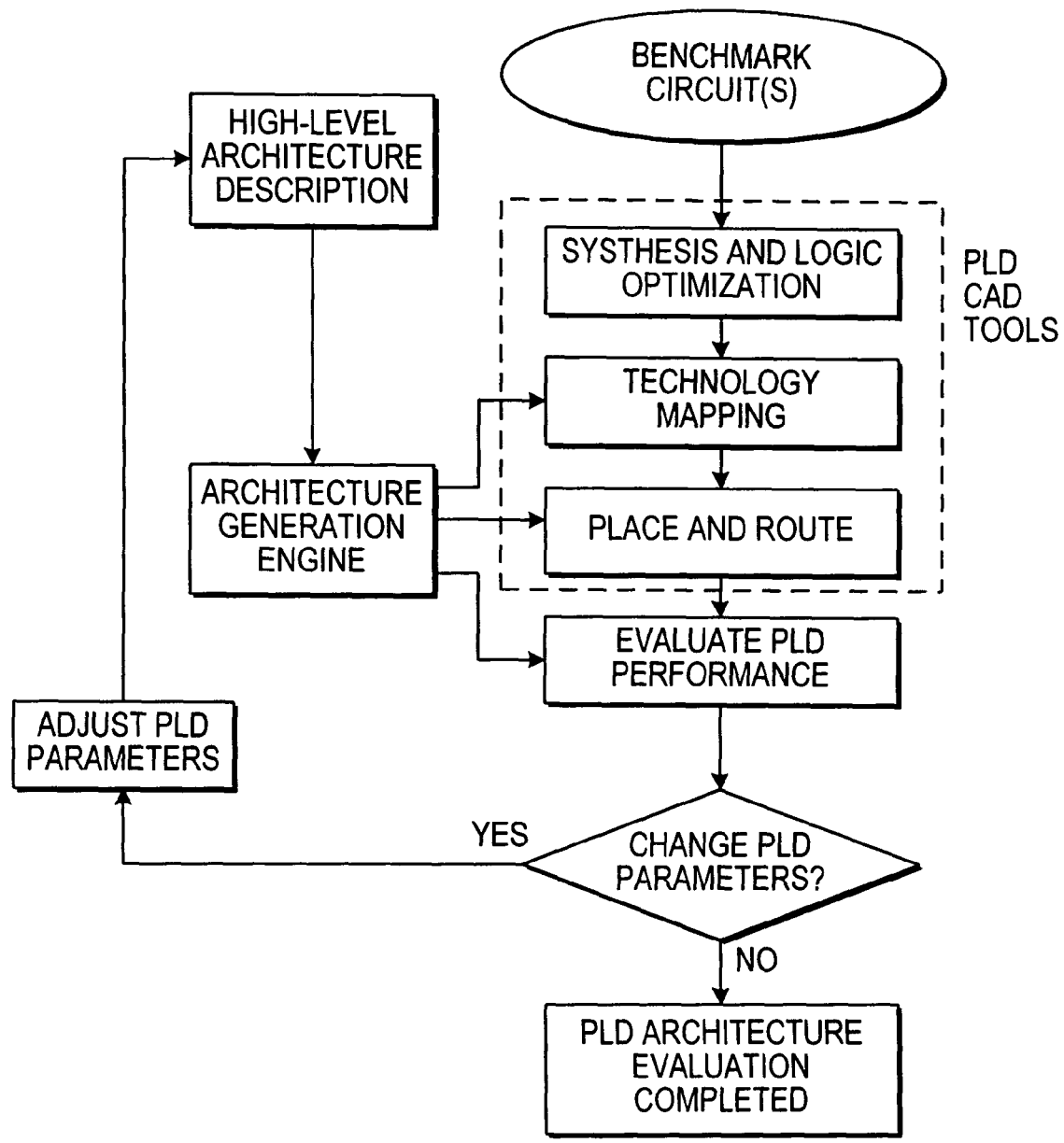
FIG. 3 is a flow diagram of an architecture generation system according to an embodiment of the invention.

FIG. 3 shows an example of the overall design flow proposed by this invention for the generation and evaluation of PLD architectures. The starting point of the invention is the realization that in order to make descriptions of PLD architectures easy to create, they should be parameterized in ways that are intuitive to PLD designers. Essentially, the PLD is described in a high-level PLD architecture specification language. The architecture generation engine converts the high-level description of the PLD architecture into the fully detailed description required by CAD tools to implement circuits in the PLD. The fully detailed description can also be used to estimate the operational parameters of circuits implemented by this architecture.

A preferred implementation of representing a PLD architecture in a high-level description language and of automatically generating a fully detailed representation of the architecture is now described. Note that many variations of this preferred embodiment are possible, including using only a subset of the listed parameters or using a different set of parameters.

For a typical implementation of a PLD (such as that shown in FIG. 1), the high-level description file specifies the following parameters:

The interconnect wires segments used in the PLD. For each wire segment type, the following parameters may be specified:

The segment length or the number of logic blocks spanned by a wire segment;

The wire width and spacing between adjacent wires or the wire resistance and capacitance or other delay metric;

The fraction or the absolute number of tracks in a channel that are of this segment type;

The type of switch (pass-transistor or tri-state buffer, drive strength of the switch) used to connect a wire segment of this type to other routing segments;

The switch-block internal population of this segment type (discussed below); and The connection-block internal population of this segment type (discussed below).

The programmable routing switches used in the PLD, including:
- Type of switch (e.g. pass-transistor, tri-state buffer, multiplexer, antifuse, laser programmable, etc.);
- The delay of the switch (which may be a description of the delay model such as the Elmore delay or SPICE delay model, or a simple delay number); and
- Area of the switch or some other parameter such as the equivalent resistance that allows an area model to estimate the area of the switch.

Each type of logic block and I/O block in the PLD, including a list of the input and output pins of each block, any logical equivalence between these pins, and the physical side or sides from which each pin is accessible. Logical equivalence refers to nodes that are functionally equivalent, such as all the inputs of a look-up table;

Description of the internal functionality of the logic and I/O blocks including:
- Number, type, and permissible connections between the subcomponents of each function block; or
- A binary decision tree diagram of all logic functions the block can implement; or
- Logic library of all the logic functions the block and/or subcomponents can perform.

The number of logic or I/O blocks of each type that can be placed at each physical location within a PLD;

The relative widths of the various routing channels in the PLD;

The switch block topology used to connect the routing tracks (i.e., which tracks connect to which other tracks at a switch block—a switch block is the point where horizontal and vertical routing channels intersect);

The number ($F_{c,input}$) and type of switches allowing each logic block input pin to connect to each channel near it, or optionally, a more detailed description of the pattern of switches between each logic block input pin and the wires in the channel near it;

The number ($F_{c,output}$) and type of switches allowing each logic block output pin to connect to each channel near it, or optionally, a more detailed description of the pattern of switches between each logic block output pin and the wires in the channel near it;

The number ($F_{c,pad}$) and type of switches allowing each I/O block input or output pin to connect to each channel near it, or optionally, a more detailed description of the pattern of switches between each logic block output pin and the wires in the channel near it;

The number and type of switches used to connect routing wires of each type to each other, or optionally, the set of switch patterns to be used to connect wires in the routing channels; and The delay through each of the combinational and sequential paths through each type of logic and I/O block. Optionally, this delay may be a delay model rather than a constant delay number for each path.

Figure 4:
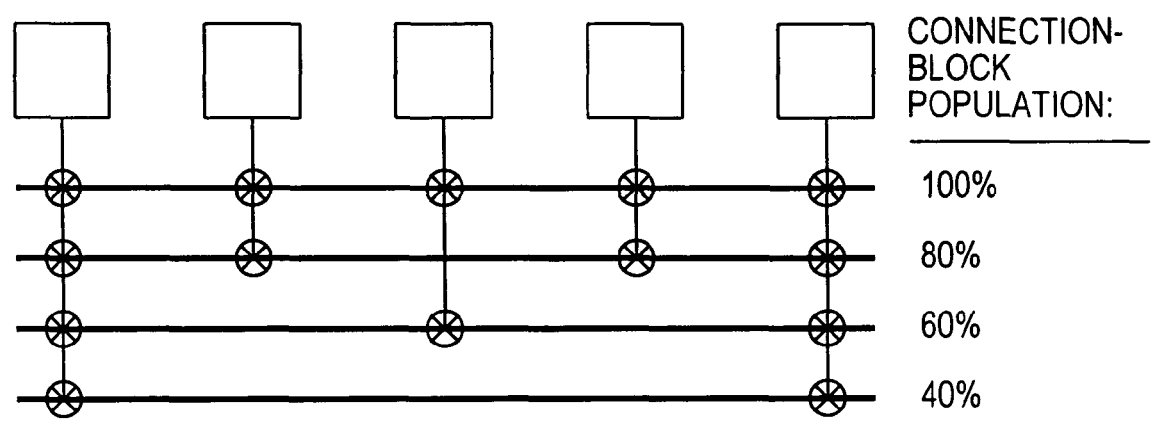
FIG. 4 is a schematic diagram showing possible connection-block population values for length 5 wire segments.

Two of the parameters listed above, switch-block and connection-block internal population, are known but may not be familiar to many PLD researchers. They indicate whether or not routing wires and logic blocks, respectively, can connect to the interior of a wire segment that spans multiple logic blocks, or if connections to a wire can be made only at its ends. It has been taught that a wire segment is either completely internally populated or completely depopulated. However, this concept can be expanded to include the notion of partial depopulation. For example, a length five segment spans five logic blocks. If a connection-block population of 100% is specified, this wire segment can connect to all five logic blocks it passes, so it is fully internally populated. If the connection-block population is 40%, it can only connect to the two logic blocks at its ends, so it is internally depopulated. If a connection-block population of 60% is specified, the wire can connect to the two logic blocks at its ends and one logic block in its interior, so it is partially internally depopulated. FIG. 4 illustrates the four possible values of connection-block population for a length five wire. Switch-block population is specified in a similar percentage form.

Note that the distribution of wire types can be specified as fractions of the channel width, W, rather than as an absolute number of tracks of each type. For example, the PLD designer might specify that there are 20% of wires having length=2 and 80% of wires having length=5. This allows a user to evaluate architectures with different W values to determine the routability of an architecture without changing the architecture file. Similarly, the various $F_c$ values can be specified either as absolute numbers (e.g., 5 tracks) or as a fraction of the traces in a channel (e.g., 0.2*W).

Other parameters which may be either specified by the PLD designer or which the CAD toolset can determine automatically such that a given application circuit will fit into the generated PLD architecture are:
- The absolute width (in routing tracks) of some or all of the routing channels; and
- The number of logic blocks in the PLD (i.e., the size of the array of logic blocks).

FIG. 5 shows a high-level architecture description file for a PLD in which the logic block is a 4-input look-up table plus a register. The description is concise and conveys all the information that the PLD designer would need to completely describe the PLD architecture of interest. While this is a simple example, even complex PLD architectures can be easily described in the same concise, but precise methodology. The "VPR User Manual," incorporated herein by reference, by Vaughn Betz, one of the inventors of the invention herein described, explains the design and syntax of the description file. The VPR User Manual also explains the terminology used in the architecture description file.

While the architecture parameters listed above are easy for PLD designers to understand and specify, they are not appropriate for use as an internal architecture representation for a router. Internally, known CAD tools use a routing-resource graph to describe the PLD; this is more general than any parameterization, since it can specify arbitrary connectivity. It also makes it much faster to determine connectivity information, such as the wires to which a given wire segment can connect, since this information is explicitly contained in the graph.

Figure 6:
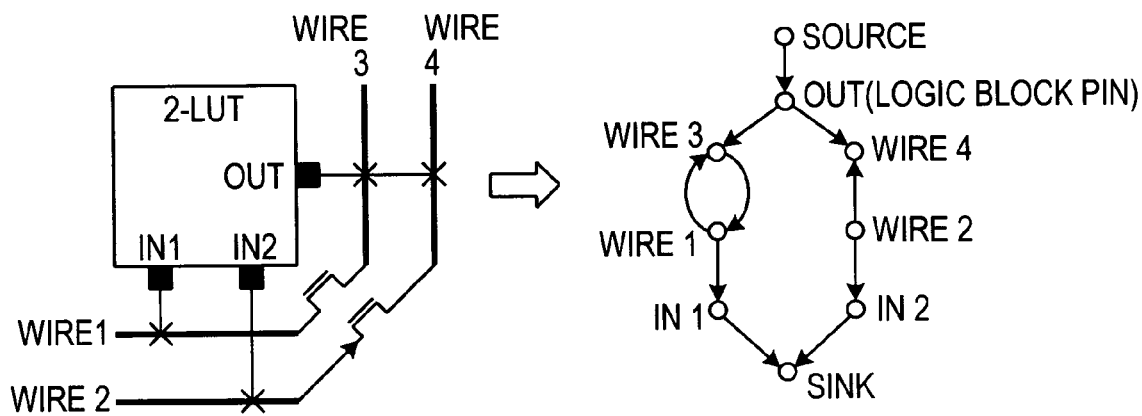
FIG. 6 is an example of architecture modeled via a directed graph.

Each wire and each logic block pin becomes a node in this routing-resource graph and each switch becomes a directed edge (for uni-directional switches, such as buffers) or a pair of directed edges (for bi-directional switches, such as pass transistors) between the two appropriate nodes. FIG. 6 shows the routing-resource graph corresponding to a portion of a PLD whose logic block contains a single 2-input, 1-output look-up table (LUT).

Often PLD logic blocks have logically equivalent pins; for example, all the input pins to a LUT are logically equivalent. This means that a router can complete a given connection using any one of the input pins of a LUT; changing the values stored in the LUT can compensate for any re-ordering of which connection connects to which input pin performed by the router. This logical equivalence is modeled in the routing-resource graph by adding source nodes at which all nets begin and sink nodes at which all net terminals end. There is one source node for each set of logically-equivalent output pins, and there is an edge from the source to each of these output pins. Similarly, there is one sink node for each set of logically-equivalent input pins, and an edge from each of these input pins, to the sink node.

To reduce the number of nodes in the routing-resource graph, and hence save memory, a capacity is assigned to each node. A node's capacity is the maximum number of different nets that can use this node in a legal routing. Wire segments and logic block pins have capacity one, because only one net may use each. Sinks and sources can have larger capacities. For example, in a 4-input LUT, there is one group of four logically-equivalent inputs, so there is one sink of capacity four. If a capacity of four could not be assigned to the sink, four logically-equivalent sinks would have to be created and connected to the four input pins via a complete bipartite graph ($K_{4,4}$), wasting considerable memory.

To perform timing-driven routing and timing analysis, and to graphically display the architecture, more information is needed than just the raw connectivity embodied in the nodes and edges of the routing-resource graph. Accordingly, each node in the graph is annotated with its type (wire, input pin, etc.), location in the PLD array, capacitance and metal resistance. Each edge in the graph is marked with the index of its "switch type," allowing retrieval of information about the switch intrinsic delay, equivalent resistance, input and output capacitance and whether the switch is a pass transistor or tri-state buffer.

As described earlier, there are compelling reasons to allow PLD designers to specify architectures in an understandable, parameterized format, and for the routing tools to work with a more detailed (e.g. graph-based) description. Thus, the capability illustrated in FIG. 3—a tool that can automatically generate a detailed architecture description (including the routing-resource graph) from a set of specified architecture parameters—is desirable. This is a difficult problem for two reasons:

1. A good architecture should be created with the specified parameters. That is, the unspecified properties of the architecture should be set to "reasonable" values.
2. Simultaneously satisfying all the parameters defining the architecture is difficult. In some cases, the specified parameters conflict and over-specify the FPGA, making it impossible to simultaneously satisfy all the specified constraints.

Figure 7:
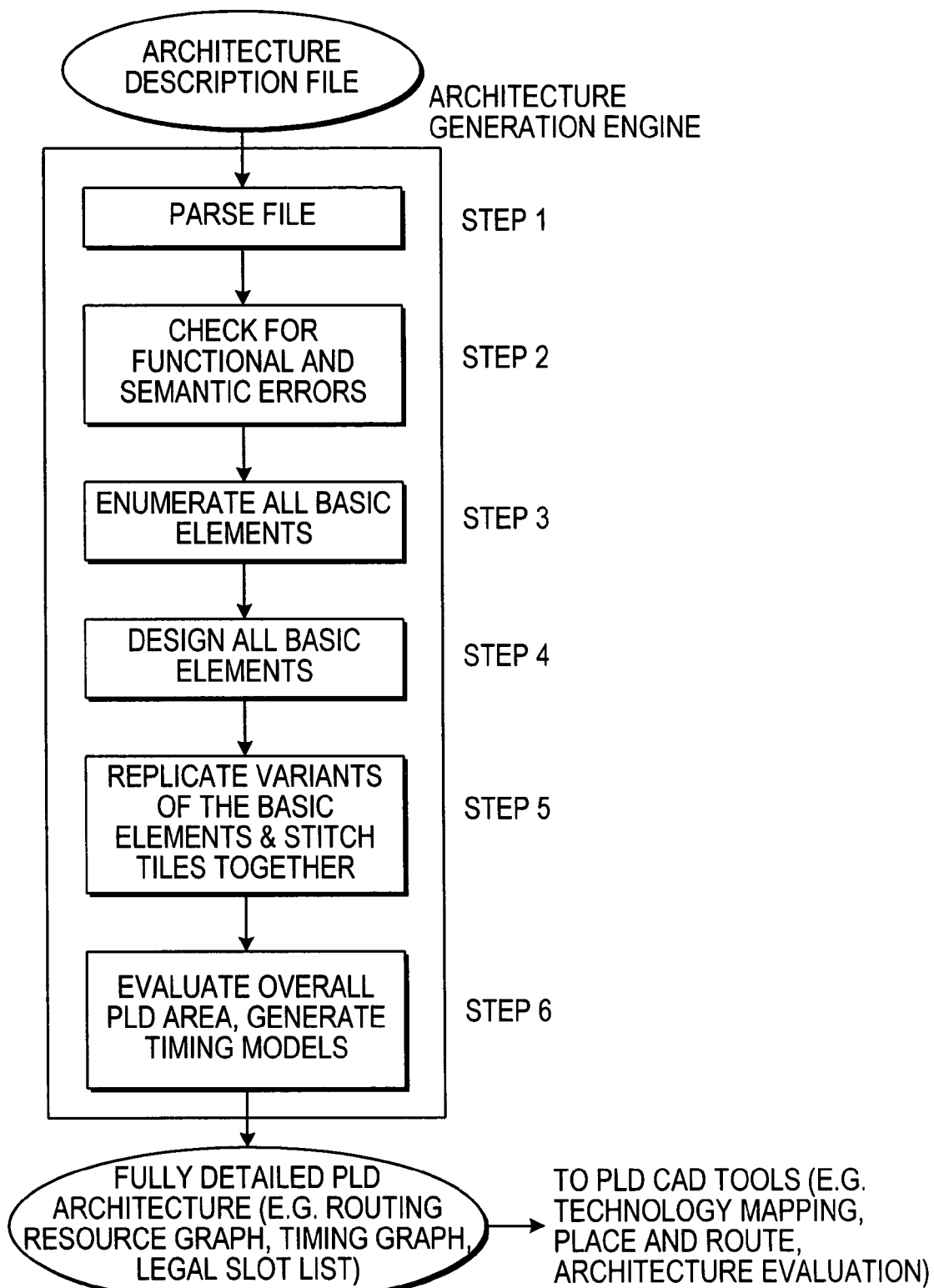
FIG. 7 is a typical flow diagram for the architecture generation engine in accordance with the invention.

FIG. 7 shows a flow diagram for the architecture generation engine in accordance with the invention. Step one includes simply parsing the architecture description file into the internal data structures of the architecture generation engine. In step two, the architecture generation engine checks for both semantic errors (such as missing or invalid PLD architecture description language keywords) and functional errors. Functional errors are more subtle than semantic errors—they involve specifying a PLD which is either not realizable or is obviously a very poor (e.g., unroutable) PLD architecture. Examples of functional errors include specifying a PLD in which certain logic block input or output pins cannot connect to any wires, specifying wires which cannot be reached (via programmable switches) from any other wire or function block pin, or specifying an architecture in which there are no routing paths between certain function blocks. When such functional errors are found, the architecture generation tool immediately informs the user so errors can be corrected before much time is spent analyzing such a poor PLD architecture.

In step 3, the architecture generation engine determines all the unique "basic elements" which will have to be generated in order to create the specified PLD architecture. Typically, the unique basic elements will be one of each function block (I/O or logic block) specified, all the unique horizontal and vertical channels (i.e., one of each different type of routing channel specified) and all the unique switch patterns required by the architecture. Typically the unique switch patterns will consist of one connection box (function block pins to routing wires switch pattern) for each side of each type of function block, and one switch block (switch pattern governing the connection of routing wires to other routing wires) for each distinct pair of crossing channels (usually vertical and horizontal channels).

In step 4, each of the unique basic elements is generated. To generate each unique channel, for example, the number of wires in this type of channel is determined, the type (length, speed, etc.) of each wire in this channel is fixed, and the break points at which wire segments end are chosen. To generate each unique switch pattern, heuristic algorithms may be used in order to construct a switch pattern that meets the specifications on the number and type of switches to be used and on how many switches should attach to each wire or pin (and any other specifications) and that results in good routability (i.e., a good PLD). The problem of generating good switch patterns is discussed below. Once all the basic elements have been generated, the architecture generation engine moves on to step 5, where it replicates variants of these basic elements and stitches them together to create a PLD that matches all the architectural specifications and that is easy to lay out. As described below, creating an entire PLD from these basic patterns is more complex than simply replicating these switch patterns and basic channels across the PLD—they should be stitched together in a more involved way.

Finally, in step 6, the architecture generation engine can traverse the data structures defining the now fully-detailed PLD architecture and apply built-in area, delay, and power models to each circuit element making up the architecture. The output of this stage is an estimate of the PLD area and an estimate of the PLD delay and power, or a delay and power model of the entire PLD that can be used to estimate the speed and power consumption of an application circuit implemented in this PLD architecture.

The fully detailed PLD architecture can then be written out to files or transferred through memory to a CAD tool or toolset that can automatically implement application circuits in the PLD.

There are two major difficulties that arise in automatically generating PLD architectures in this way. The first difficulty arises because the PLD designer is not required to specify every conceivable parameter and every possible interaction between all parameters. Instead, the focus of the high-level architecture description methodology is to enable the PLD designer to specify the important parameters and have the architecture generator automatically adjust other parameters of the architecture so that a good PLD architecture results. Consider an example that occurs in step 4 of FIG. 7. The high-level architecture description methodology requires that the PLD designer specify the number of tracks to which input and output pins can connect ($F_{c,input}$ and $F_{c,output}$) rather than specifying the complete connection block switch pattern. This simplifies the task of describing a PLD, but it means that the architecture generation engine should generate a good connection block switch pattern automatically.

Figure 8A:
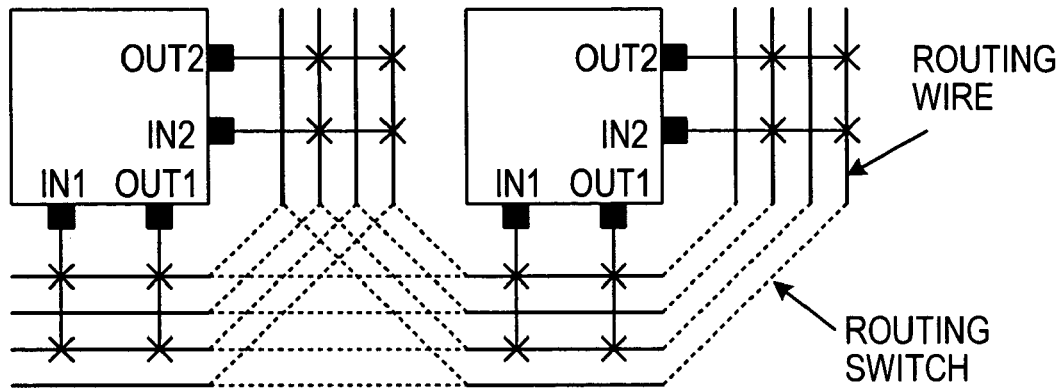
FIG. 8(a) is a simplified block diagram showing a poor connection block pattern.
Figure 8B:
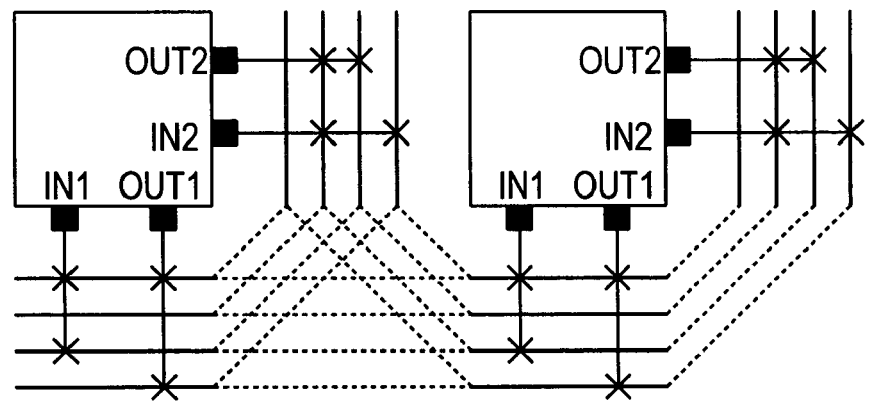
FIG. 8(b) is a simplified block diagram showing a good connection block pattern.

Consider this connection block problem in more detail. Assume the switch pattern chosen should:

Ensure that each of the W tracks in a channel can be connected to roughly the same number of input pins and roughly the same number of output pins;

Ensure that each pin can connect to a mix of different wire types (e.g., different length wires);

Ensure that pins that appear on multiple sides of the logic block connect to different tracks on each side to allow more routing options;

Ensure that logically-equivalent pins connect to different tracks, again, to allow more routing options; and Ensure that pathological switch topologies in which it is impossible to route from certain output pins to certain input pins do not occur. FIG. 8 shows one example of a pathologically bad switch pattern—some logic block output pins cannot drive any tracks that can reach certain input pins.

Clearly, this is a complex problem. In essence, the proper connection block pattern is a function of $F_{c,input}$, $F_{c,output}$, W, the segmentation distribution (lengths of routing wires), the logical equivalence between pins, and the side(s) of a logic block from which each pin is accessible. The last condition is also a function of the switch block topology. The architecture generator would typically use a heuristic algorithm that attempts to build a connection block that satisfies the five criteria above, but it will not necessarily perfectly satisfy them all for all architectures.

The second difficulty in generating an architecture automatically is simultaneously meeting all the user-defined specifications. This difficulty is illustrated with an example that shows it often takes considerable thought to simultaneously satisfy the specifications. The focus in this example is on Step 5 of FIG. 7. Consider an architecture in which:

Each channel is three tracks wide.

Each wire is of length 3.

Each wire has an internal switch block population of 50%. That is, routing switches can connect only to the ends of a wire segment (2 of the 4 possible switch block locations).

The switch block topology is disjoint. In this switch block, wires in track 1 always connect only to other wires in track 1 and so on. This is the switch block topology used in the original Xilinx 4000 FPGAs.

Figure 9A:
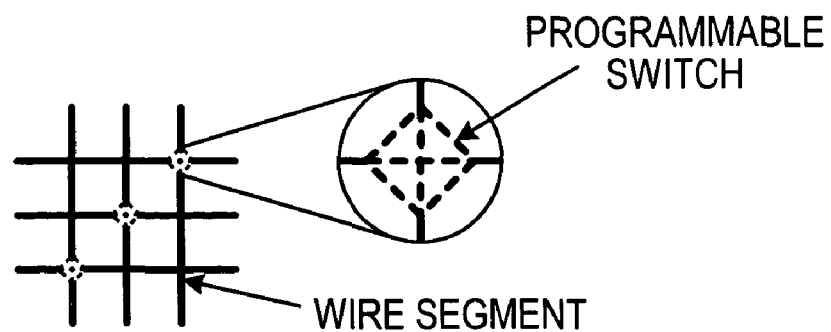
FIG. 9(a) is a simplified diagram showing a disjoint switch block.
Figure 9B:
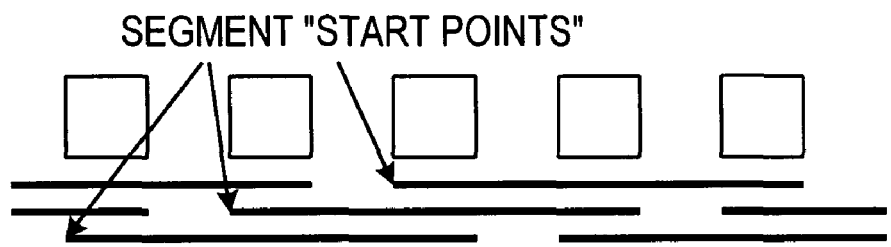
FIG. 9(b) is a simplified diagram showing a segmentation distribution.

FIGS. 9(a) and (b) respectively show the disjoint switch block topology and a channel containing 3 wires of length 3. Note that the "start points" of the wire segments in FIG. 9(b) are staggered. This enhances routability, because each logic block in the PLD can then reach a logic block two units away in either direction using only one wire segment. This also arises naturally in a tile-based layout, so staggering the start points of the segments in this way makes it easier to lay out the PLD. A tile-based PLD layout is one in which only a single logic block and its associated routing (one vertical channel segment and one horizontal channel segment) have to be laid out—the entire PLD is created by replication of this basic tile.

Figure 10:
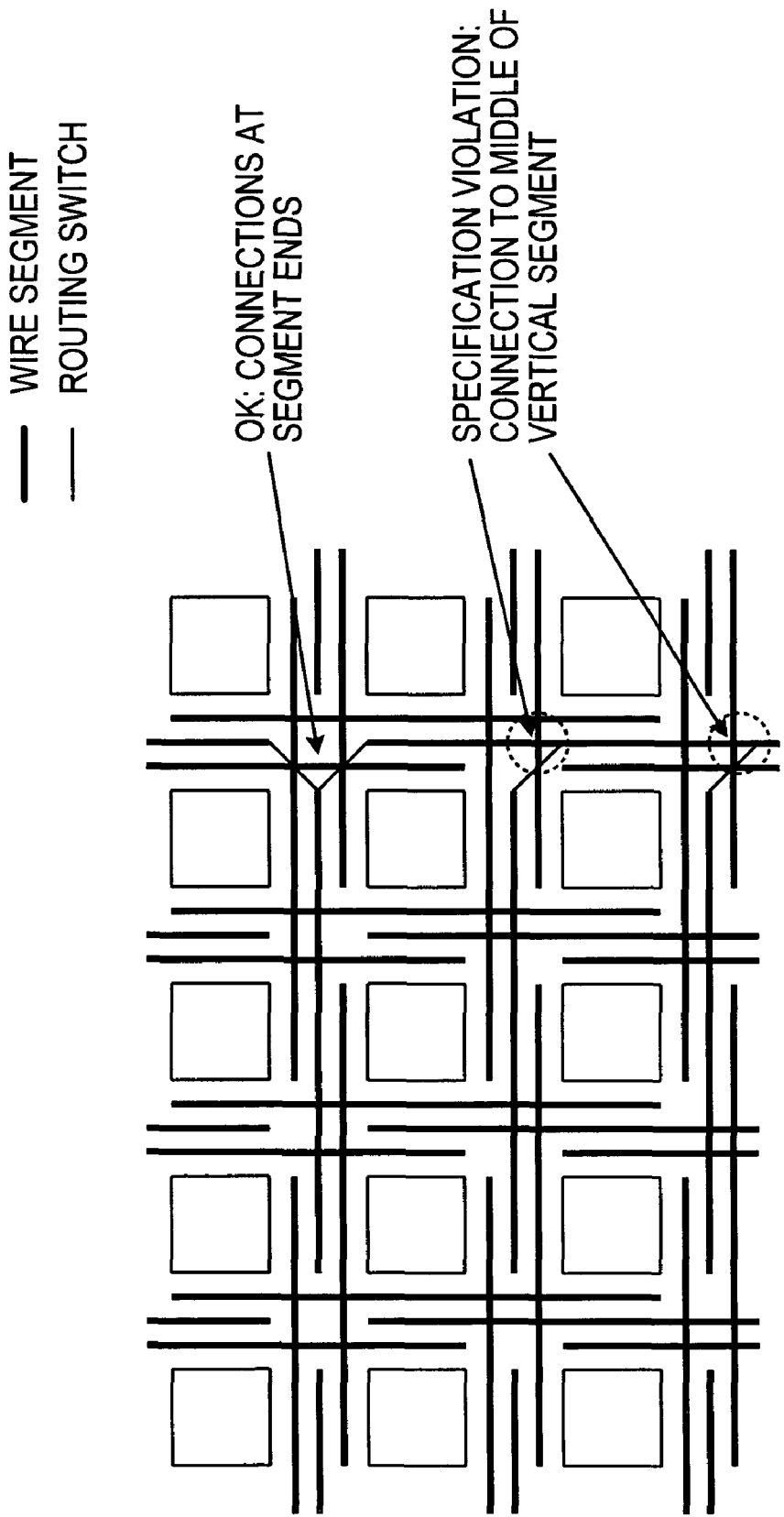
FIG. 10 is a simplified block diagram of conflicting horizontal and vertical constraints caused by replication of one channel.

The most straightforward way to create a PLD with this architecture is to create one horizontal channel and one vertical channel and then replicate them across the array. Switches are inserted between horizontal and vertical wire segments that the switch block and internal population parameters indicate should be connected. FIG. 10 shows the results of such a technique, where only a few of the routing switches have been shown for clarity. Note, however, that this PLD does not meet the specifications. By inserting routing switches at the ends of the horizontal segments, connections are allowed into the middle of vertical segments. However, the specifications indicate that segments should have routing switches only at their ends. If switches are not inserted at the ends of the horizontal segments, however, connections to the ends of the horizontal segments cannot be made, so the specifications are again violated. This problem is called a conflict between the horizontal constraints and the vertical constraints.

Figure 11:
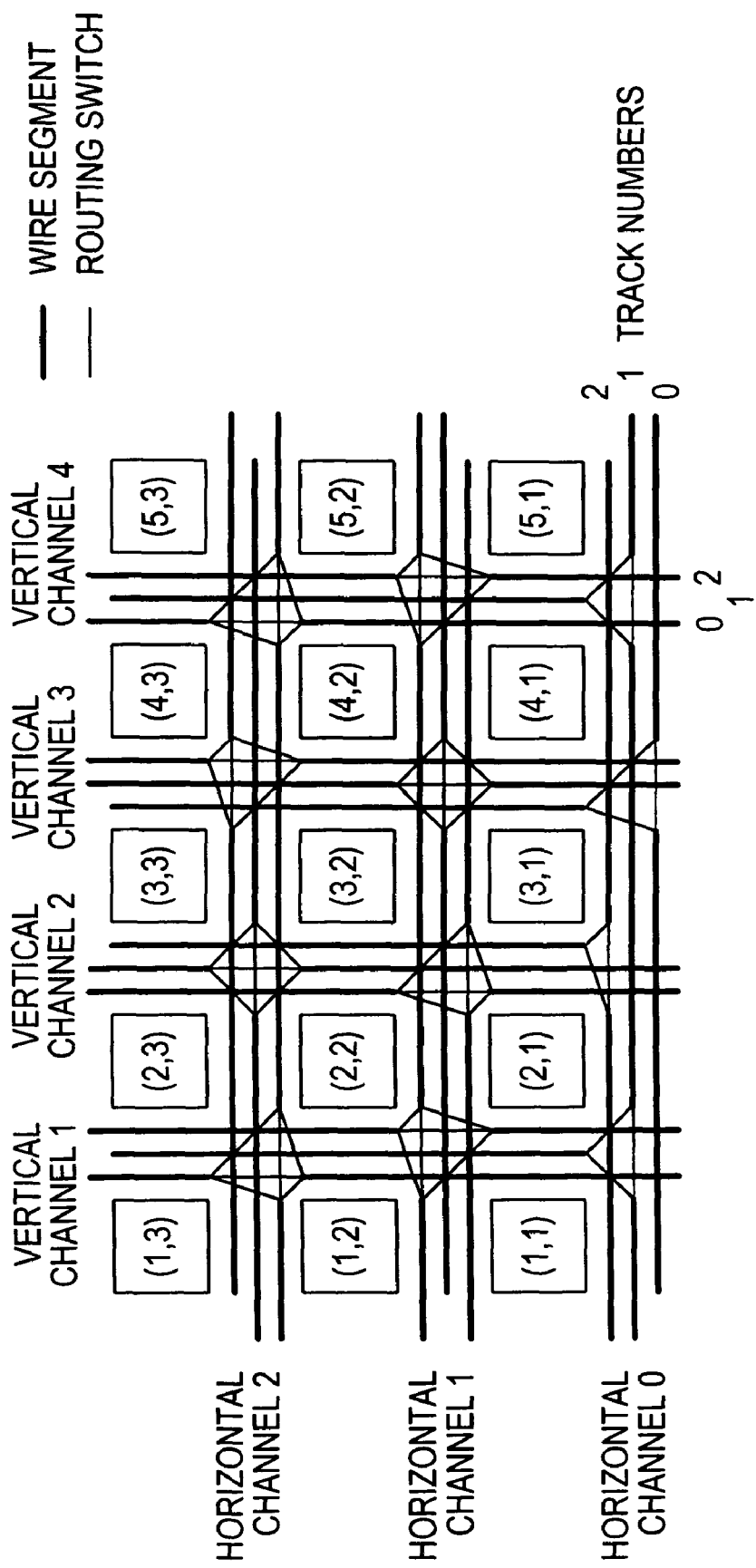
FIG. 11 is a simplified block diagram of satisfied horizontal and vertical constraints within a PLD coordinate system resulting from adjustment of segment start points.

The solution to this problem is shown in FIG. 11. Instead of simply replicating a single channel, the "start points" of the segments in each channel have to be adjusted. As FIG. 11 shows, this allows the horizontal and vertical constraints to be simultaneously satisfied. The specification for the PLD has been completely realized—every segment connects to others only at their ends, and the switch block topology is disjoint. FIG. 12 shows an implementation of this architecture using a single layout tile. This is an additional advantage of the "segment start point adjustment" technique—not only are the specifications fully met, but an easily laid-out PLD is created.

In order to describe the adjustment of the segment start points more clearly, a PLD coordinate system is defined. Let the logic block in the lower left corner of the logic block array have coordinates (1,1). The logic block to its right has coordinates (2,1), and the logic block above it has coordinates (1,2), as FIG. 11 shows. A horizontal channel has the same y-coordinate as the logic block below it, and a vertical channel has the same x-coordinate as the logic block to its left. The tracks within each channel are numbered from 0 to 2, with track 0 being the bottom most track in a horizontal channel or the leftmost track in a vertical channel.

The proper adjustment shifts the start point of each segment back by one logic block, relative to its start point in channel j when constructing channel j+1. For example, in FIG. 11, the left ends of the wire segments in track 0, horizontal channel 0, line up with the logic blocks that satisfy:

$$(i+2) \bmod 3 = 0 \qquad (1.1),$$

where i is the horizontal (x) coordinate of a logic block. In channel 1, track 0, however, the left ends of the wire segments line up with logic blocks that satisfy:

$$(i+3) \bmod 3 = 0 \qquad (1.2)$$

A similar shifting back of start points is performed in the vertical channels—the start point of each segment in channel i+1 is moved back one logic block relative to its start point in channel i.

The shifting of segment start points allows the horizontal and vertical constraints in a PLD to be met if either of the following two conditions is met:

The disjoint switch block topology is used. The segmentation distribution and segment internal populations can have any values. Or, All segments are fully switch-block populated. The segmentation distribution and switch block topology can have any values.

If either of these conditions is satisfied, the shifting of segment start points also makes a tile-based layout possible if one additional constraint is satisfied: the number of tracks of length L is divisible by L, for all segment lengths L.

A method has not yet been found to simultaneously satisfy the horizontal and vertical constraints when a switch block topology other than disjoint is used with internally-depopulated segments. It is an open question as to whether there is any method of satisfying both sets of constraints in this most general case. In cases where the horizontal and vertical constraints cannot be made to agree, there are locations in the PLD where a vertical wire wishes to connect to a horizontal wire, but the horizontal wire does not want a switch there, or vice versa. This conflict is resolved by inserting the switch, in which case it is preferable to err on the side of too many switches in the routing, rather than too few.

Once the detailed architecture description has been created, and a circuit has been embedded in it by a CAD toolset, the architecture evaluation engine automatically computes important metrics of the PLD architecture quality (Step 6 of FIG. 7). The metrics it computes include:

The estimated area required to build the PLD. The architecture evaluation engine can compute this by traversing the detailed PLD description (the routing resource graph and the legal slot list) and by using built-in area models to estimate the area required by each wire and switch in the programmable routing and by each logic or I/O block. This area estimate can be based on metal area, active area, or both. Details of how the area model can be calculated is given in "Architecture and CAD for Deep-Submicron FPGAs," Chapter 6, by Vaughn Betz, J. Rose, and A. Marquardt, Kluwer Academic Publishers, 1999, which is incorporated herein by reference.

The estimated circuit delay when implemented in the PLD. After the routing-resource graph is built, the architecture evaluation engine can traverse the graph and lump all parasitic switch capacitances, plus the interconnect wire capacitance, into a total capacitance value, $C_{total}$, at each node. Every node in the routing-resource graph can have a different $C_{total}$ and a different distributed resistance, $R_{wire}$. Similarly, every switch in the PLD can have a different switch resistance, $R_{switch}$, and intrinsic delay. This information is in turn used by the delay extractor using built-in delay models, such as Elmore delay, SPICE-like simulation model, AWE analysis model, or some other method. This process is described in more detail in Chapters 4 and 6 of the above-mentioned "Architecture and CAD for Deep-Submicron FPGAs" by Betz et al, incorporated herein by reference.

The estimated circuit power when implemented in the PLD.

The estimated PLD area required by the circuit when implemented in the PLD.

Thus it is seen that PLD architectures can be generated in accordance with the invention. One skilled in the art will appreciate that the invention can be practiced by other than the described embodiments, which are presented for purposes of illustration and not of limitation, and the invention is limited only by the claims which follow.

We claim:

1. A method of generating an architecture for a programmable logic device (PLD), said method comprising:
   creating a data file defining a high-level architecture description of said PLD;
   generating unique basic elements in accordance with the description in said data file;
   replicating and stitching together said basic elements to create a complete PLD architecture; and
   generating a detailed description from said complete PLD architecture for use by a CAD toolset.

2. The method of claim 1 wherein said high-level architecture description includes parameters at least partially specifying functions blocks, horizontal and vertical channels, and switch patterns.

3. The method of claim 1 wherein said high-level architecture description includes constraints for said architecture.

4. The method of claim 3 wherein said constraints include at least one of:
   overall dimensions of said PLD; and
   number of logic blocks within all or a portion of said PLD.

5. The method of claim 3 wherein said high level description does not completely constrain said architecture.

6. The method of claim 1 wherein said high level description overspecifies said architecture.

7. The method of claim 1 wherein said basic elements include a function block.

8. The method of claim 7 wherein said function block is a logic block.

9. The method of claim 8 wherein said logic block has a fixed logic function.

10. The method of claim 9 wherein said replicating and stitching comprises replicating said logic block and creating an interconnect network of metal wires to interconnect said replicated logic blocks in accordance with the description in said data file.

11. The method of claim 7 wherein said function block includes an I/O block.

12. The method of claim 7 wherein said function block includes a memory block.

13. The method of claim 12 wherein said memory block comprises a random access memory.

14. The method of claim 7 wherein said function block includes a multiplier.

15. The method of claim 7 wherein said function block includes a digital signal processing block.

16. The method of claim 1 wherein one of said basic elements is a transistor.

17. The method of claim 16 wherein said stitching includes creating an interconnect network to interconnect said transistor to other said basic elements in accordance with the description in said data file.

18. The method of claim 1 wherein said stitching includes laying out metal wiring to interconnect said basic elements.

19. The method of claim 1 wherein said basic elements include a routing channel.

20. The method of claim 19 wherein said routing channel includes:
   information on the width of said routing channel;
   number and type of switches used to connect routing wires to each other in said routing channel;
   a detailed description of the pattern of switches used to connect routing wires in said routing channel; and
   number of interconnect wire segments in said routing channel.

21. The method of claim 1 wherein said basic elements include interconnect wire segment type.

22. The method of claim 21 wherein said wire segment type includes:
   length of a wire segment given in absolute or relative terms;
   width of said wire segment given in absolute or relative terms;
   spacing between adjacent wire segments given in absolute or relative terms;
   the fraction or absolute number of tracks in a channel of said wire segment type;
   the type of switch used to connect a wire segment of said wire segment type to other routing segments; and timing information about said wire segment type useable by said CAD toolset to estimate the speed achieved by circuits implemented in said PLD.

23. The method of claim 1 wherein said basic elements include function blocks and switch patterns for connecting interconnect wires to said function blocks.

24. The method of claim 23 wherein said switch patterns include:
- number and type of switches allowing a function block input pin to connect to each channel near it;
- a detailed description of the switch patterns between said function block input pin and wires in the channel near it;
- number and type of switches allowing a function block output pin to connect to each channel near it; and
- a detailed description of the switch patterns between said function block output pin and wires in the channel near it.

25. The method of claim 1 wherein said basic elements include a programmable routing switch.

26. The method of claim 1 wherein said basic elements include a switch block for programmably connecting horizontal and vertical routing channels.

27. The method of claim 1 wherein said basic elements include a description of a tile.

28. The method of claim 1 wherein said detailed architecture description includes a routing resource graph that describes elements of a PLD's programmable interconnect resources.

29. The method of claim 28 wherein said programmable interconnect resources include routing wires, routing switches, and interfaces of the routing wires and switches to the function blocks.

30. The method of claim 1 wherein said detailed architecture description includes a timing graph that shows timing dependency or timing information related to the PLD.

31. The method of claim 1 wherein said detailed architecture description includes the type of function blocks that can be assigned to each discrete location node within the PLD.

32. A system for generating an architecture for a programmable logic device (PLD), said system comprising:
- a data file defining a high-level architecture description of said PLD; and
- an architecture generation engine for:
  - generating unique basic elements in accordance with the description in said data file, said basic elements including at least one logic block of fixed logic function comprising at least one transistor;
  - replicating and stitching together said basic elements to create a complete PLD architecture, said stitching together comprising laying out metal wiring to interconnect said basic elements; and
  - generating a detailed description from said complete PLD architecture for use by a CAD toolset.

33. The system of claim 32 further including an evaluation engine for using said detailed description to estimate at least one of layout area, power consumption, and speed of said PLD.

34. The system of claim 32 further including a computer aided design tool for implementing said detailed description.

* * * * *